(12) United States Patent
Tate et al.

(10) Patent No.: US 6,241,537 B1
(45) Date of Patent: Jun. 5, 2001

(54) ESD PROTECTIVE CONNECTOR APPARATUS

(75) Inventors: Joe Tate, San Jose; Bruce Reynolds, Gilroy; David Northway, San Carlos; Gary Responte, Fremont; Sean O'Hara, Foster City, all of CA (US)

(73) Assignee: Palm, Inc., Santa Clara, CA (US)

( * ) Notice: Subject to any disclaimer, the term of this patent is extended or adjusted under 35 U.S.C. 154(b) by 0 days.

(21) Appl. No.: 09/574,664

(22) Filed: May 18, 2000

(51) Int. Cl.⁷ .................................................. H01R 13/648
(52) U.S. Cl. ...................... 439/108; 439/928.1; 439/951; 361/799
(58) Field of Search ................................ 439/108, 928.1, 439/934, 951; 361/799, 772; 174/51

(56) References Cited

U.S. PATENT DOCUMENTS

| | | | |
|---|---|---|---|
| 5,052,943 | * 10/1991 | Davis | 439/357 |
| 5,220,270 | * 6/1993 | Peickert | 320/2 |
| 6,042,414 | * 3/2000 | Kunert | 439/374 |
| 6,058,000 | * 5/2000 | Koenck et al. | 361/113 |
| 6,068,496 | * 5/2000 | Penate | 439/140 |
| 6,108,200 | * 8/2000 | Fullerton | 361/686 |
| 6,115,247 | * 9/2000 | Helot | 361/686 |

* cited by examiner

*Primary Examiner*—Tulsidas Patel
(74) *Attorney, Agent, or Firm*—Van Mahamedi; Wilson Sonsini Goodrich & Rosati

(57) ABSTRACT

Embodiments of the invention include connector assembly for a handheld computer. The connector assembly includes a plurality of conductive elements disposed on a first side of a printed circuit board housed with the handheld computer. One or more of the conductive elements has a pointed end.

15 Claims, 9 Drawing Sheets

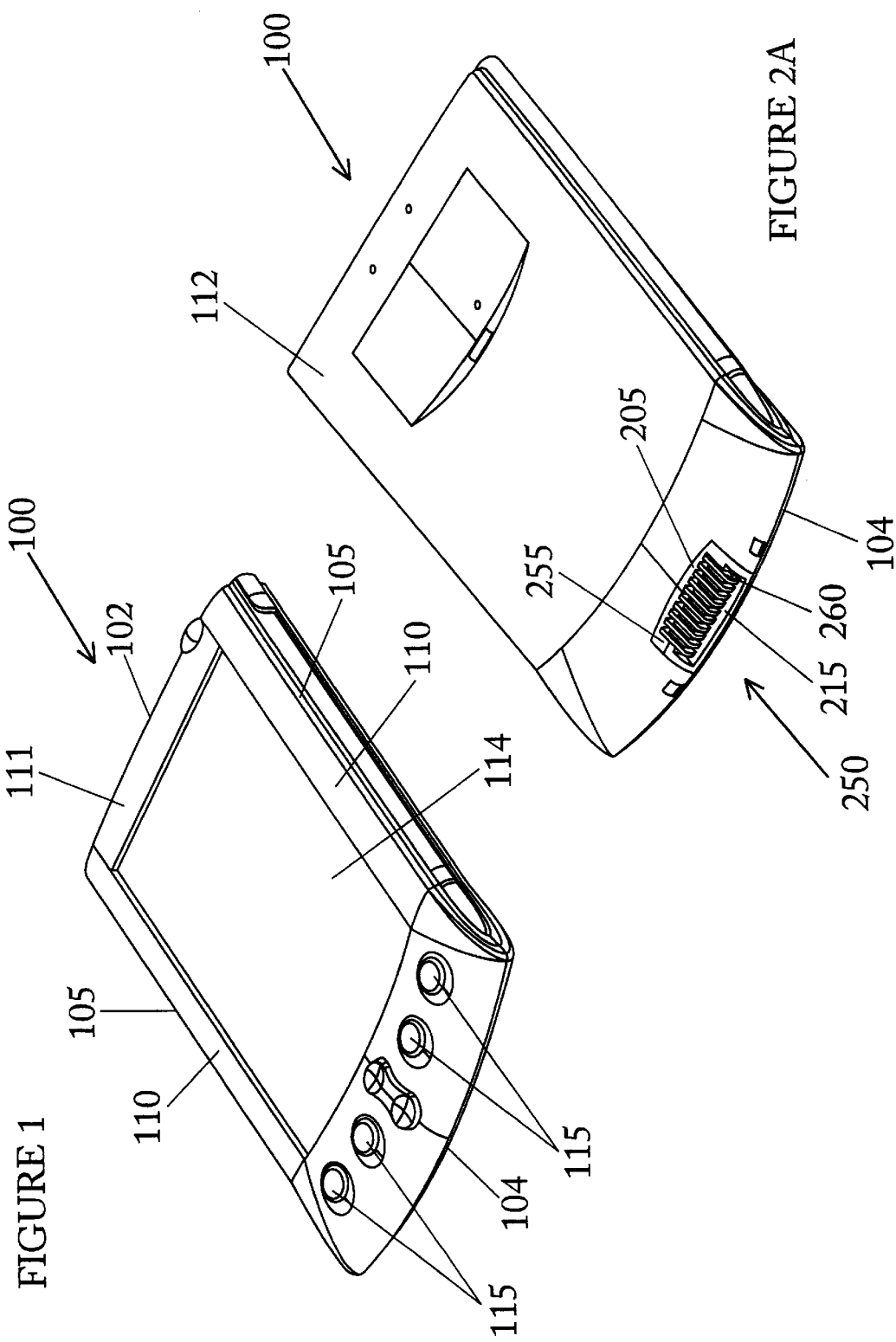

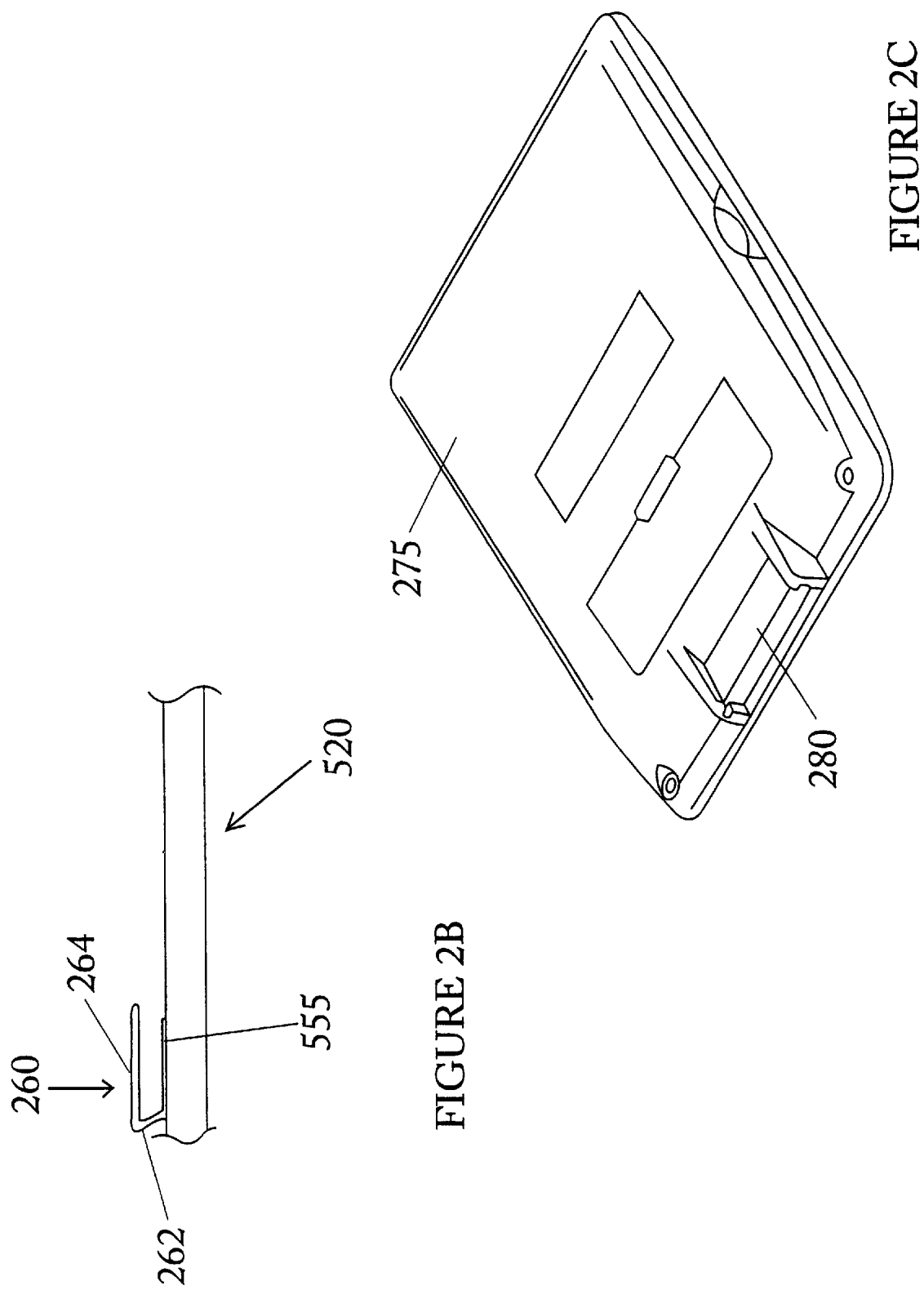

ESD PROTECTIVE CONNECTOR APPARATUS

BACKGROUND OF THE INVENTION

1. Field of the Invention

This invention pertains to handheld computers and accessory devices for handheld computers. More specifically, embodiments of this invention encompass a handheld computer with an ESD protective connector.

2. Description of the Related Art

Handheld computers use peripheral or accessory devices to enhance their abilities and functions. Typical accessory devices for handheld computers include communication cradles or docking stations, battery chargers, Universal Serial Bus (USB) devices, and modems. Generally, these devices are adapted to mate with the handheld computer using either wiping style connectors or pogo style connectors.

Until now, handheld computers were adapted to connect with accessory devices having either a wiping style or a pogo pin connector. During or after the mating process with either connector, a static electric discharge or electrostatic discharge event (EDE) can occur that can damage electronic components in the handheld computer. The static electric discharge occurs due to the buildup of static electricity on the accessory device, the user or the handheld computer. The voltages that drive an electrostatic discharge can be significant. In fact, when the humidity drops below 50% Rh, the human body can acquire and dissipate an electrostatic charge having a potential in excess of 30,000 volts. Unfortunately, many devices are susceptible to ESD damage at relatively low voltages e.g. less than 100 Volts. In fact, a discharge of only 10 Volts can destroy some types of devices.

The microelectronics of a handheld computer are particularly sensitive to damage from electrostatic discharge or ESD. This due to fact that these components are composed of micro-miniature traces and structures of alternating layers that may be insulative, conductive or semi-conductive. Rapid electrostatic discharge can cause damage to these underlying structures via the traces of the component. Thus static electricity can readily damage integrated circuits containing such traces including, microprocessors, ASICS and memory devices including RAM and ROM devices. The damage can range from erasure of memory registers and contents to physical damage of the circuits due to damage of the traces.

Handheld computers are also susceptible to such discharges. For example, when the interface connector of the handheld computer is unmated, the electronic components that are connected to this unmated connector are susceptible to receiving, through the conductive pins of the unmated connector, an electrostatic discharge current from an electrostatically charged human or other sources of an electrostatic charge. Similarly, during or after the mating process of the connector to accessory device, electrostatic current can flow from the accessory device the hand-held computer, causing damage to internal components of the handheld computer.

SUMMARY OF THE INVENTION

An embodiment of the invention includes a handheld computer including electrostatic discharge feature. The electrostatic discharge feature is configured on the connector of the handheld computer to dissipate an electrostatic charge having a voltage exceeding a threshold level upon the connector being made with another connector of an accessory device. Examples of an accessory device include communication cradles for use with handheld computers.

Among other advantages, embodiments of the invention provide a versatile connector with a current path to dissipate charge delivered by an ESD event. This feature includes potential damage from ESD events particularly during and connection and deconnection to an accessory device. Further, embodiments of the invention improve reliability in making and maintaining an electrical connection between the handheld computer and accessory device. Additionally, the current associated with an ESD event and its derivative are reduced, minimizing damage such as latchups, register erasure, data loss and physical damage.

BRIEF DESCRIPTION OF THE FIGURES

FIG. 1 illustrates a handheld computer for use with an embodiment of this invention.

FIG. 2A is a back view of the handheld computer, showing details of a connector for use with an embodiment of this invention.

FIG. 2B illustrates a single contact element for the connector shown in FIG. 2A.

FIG. 2C is a back view of a handheld computer, including a door to cover a connector, for use with an embodiment of the invention.

DETAILED DESCRIPTION

Figure 3A:
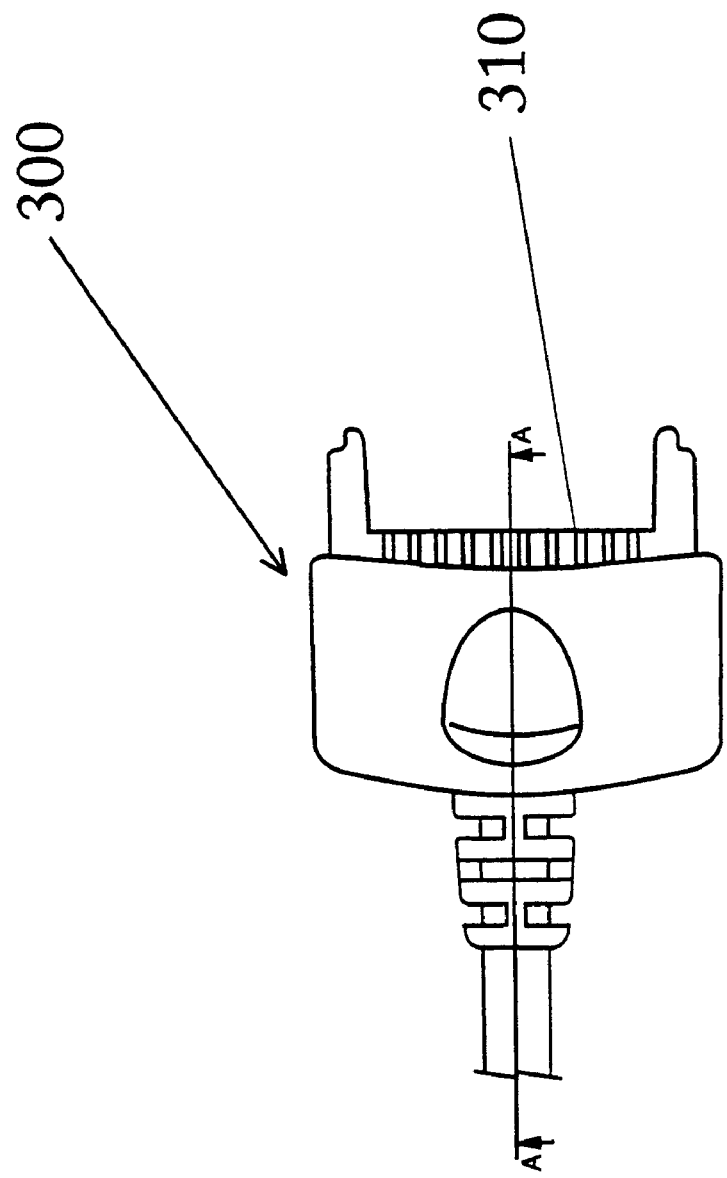
FIG. 3A illustrates a pogo connector for use with an embodiment of this invention.

Embodiments of this invention provide a versatile connector having electrostatic discharge protection capabilities for use with portable computers, and in particular, handheld computers. Such embodiments provide protection of various electronic components located inside the handheld computer, including components coupled to printed circuit boards within the handheld computer.

A. Overview

A connector for use with a handheld computer includes one or conductive elements or pads. Under embodiments of the invention, the conductive elements are at least partially surrounded by one or more spark gap structures that are each configured to discharge to a dissipative pad or ground pad.

The spark gap is configured so that when a threshold electrical potential is exceeded, as would occur during an electrostatic discharge event, current flows across the spark gap from conductive elements of the connector to ground. The electrostatic event may occur when the handheld computer is connected to an accessory device, such as a communication cradle. As a result, embodiments of the invention provide a protective pathway to ground for an electrostatic discharge current that might otherwise damage electronic components of the handheld computer.

In various embodiments the ground pad can be coupled to the handheld computer battery, capacitor or other energy storage device. These devices can be integral to or otherwise electronically coupled to the ground pad.

While embodiments described herein are described for handheld computers, other embodiments may be applicable in other types of computer devices. For example, embodiments of the invention may be incorporated into personal computers, lap tops and cell phones. In addition, the electrostatic discharge feature can be integrated into an accessory device for a handheld computer. Examples of accessory devices include communication cradles.

In an embodiment, a connector is formed from a combination of conductive elements or leads formed on a circuit board. One or more of the conductive elements are provided an electrostatic discharge feature, formed from a geometry of the conductive elements and a spark gap with a ground pad structure. The conductive elements extend communications to the electrical components of the handheld computer. One or more vias may be used to connect the conductive elements on one side of the printed circuit board to electrical components on another side of the printed circuit board.

In an embodiment, a handheld computer incorporates a dual style connector with an electrostatic discharge feature. The electrostatic discharge feature may be integrated into the printed circuit board. The dual-style connector may be formed as an extension off of the PCB. The dual-style connector enables the handheld computer to mate with multiple types of accessory devices, including wiping style connectors and pogo style connectors. An example of a dual style connector is provided by U.S. patent application Ser. No. 09/313,333, herein incorporated by reference.

In another embodiment, a housing of the handheld computer includes a sliding door. The sliding door opens to provide access to a PCB connector, including an electrostatic discharge feature. An example of such a slide sliding door is provided by U.S. patent application Ser. No. 09/037,195, herein incorporated by reference.

B. PCB Connector with Electrostatic Discharge Feature

Figure 5A:
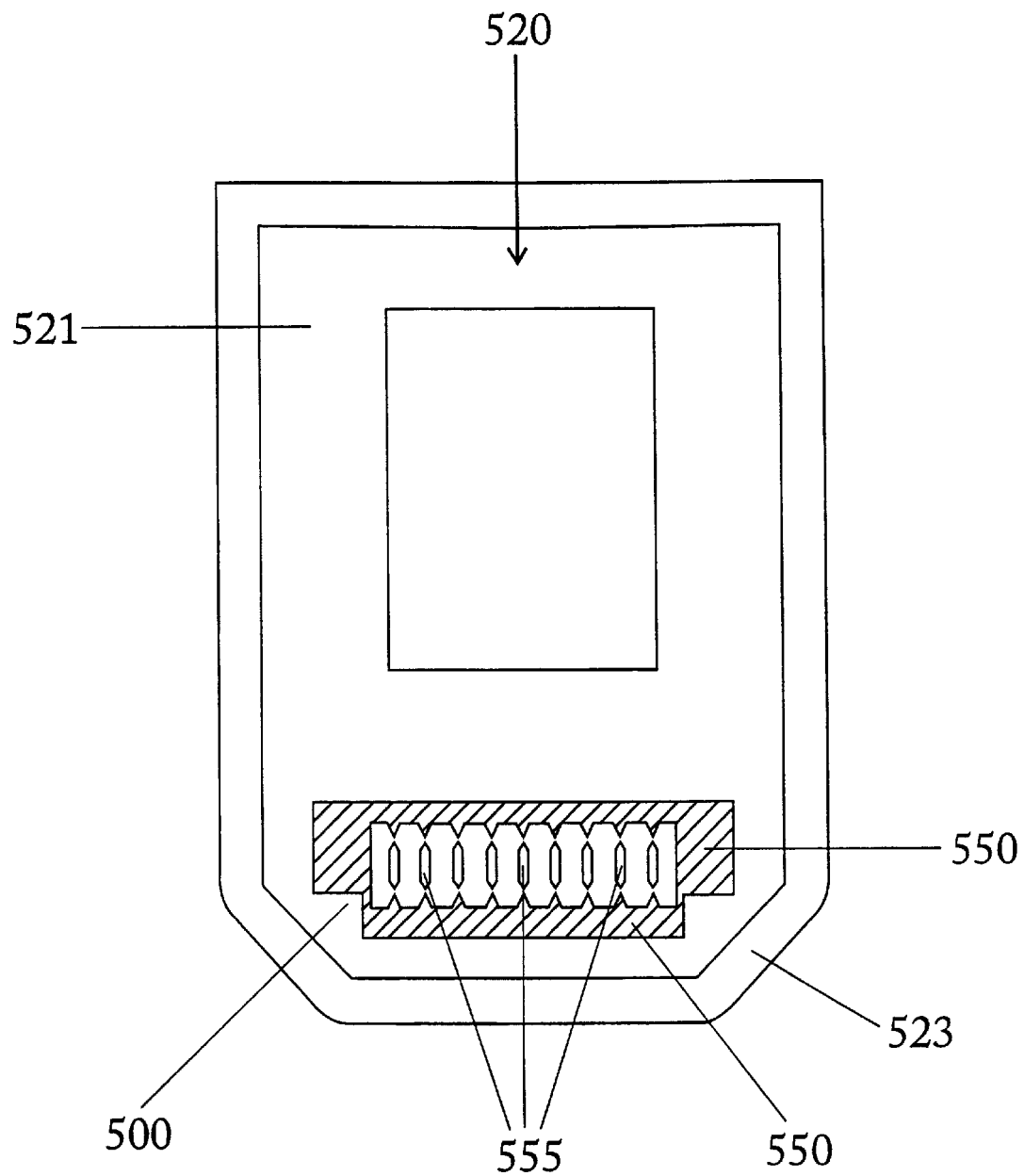
FIG. 5A is a top view showing a printed circuit board including an electrostatic discharge feature, under an embodiment of the invention.

FIG. 5A illustrates a printed circuit board (PCB) 520 retained within a housing 110 (FIG. 1) of a handheld computer 100 (FIG. 1). FIG. 5A shows a back side 521 of the PCB 520 facing a back face 112 (FIG. 2) of handheld computer 100. In the embodiment shown, back side 521 includes a PCB connector 500 having an ESD protection feature. A front side (not shown) of the PCB 520 interconnects and retains electrical components (not shown) for handheld computer 100. Examples of electrical components provided on the front side of the PCB 520, include a processor, voltatile memory, non-voltatime memory, and an analog-digital converter.

The PCB connector 500 mates with another device to extend communications to and from handheld computer 100. In one embodiment, PCB connector 500 mates with a connector of a docking port. For description herein, PCB 520 is referenced against a top-down configuration so that a top of the PCB coincides with a portion where display 114 (FIG. 1) of handheld computer 100 is made accessible. A bottom portion of PCB 520 includes PCB connector 500.

The PCB connector 500 includes a plurality of conductive elements 555. On PCB 520, the conductive elements 555 are spaced or gapped from a ground pad structure 550. A gap 570 (FIGS. 5C and 5D) between the conductive elements 555 and ground pad structure 550 enables an electrostatic discharge when an electrostatic voltage or current exceeds a threshold or breakdown level.

In the embodiment shown by FIG. 5A, PCB connector 500 is disposed a distance away from a bottom edge 523 of PCB 520. The ground pad structure 550 completely surrounds PCB connector 500, so that conductive elements 555 are separated from the bottom edge 523 of the PCB 520 by ground pad structure 550.

The pattern and number of conductive elements 555 may be configured for both serial and parallel data connections. In an embodiment, PCB connector 500 includes nine conductive elements 555 evenly spaced from one another. The nine conductive elements 555 provide eight bits of data and a parity bit.

One or more vias 560 (FIG. 5C) may be provided to extend electrical contact from the conductive elements 555 to the electrical components on the front side (not shown) of PCB 520. The vias 560 may be formed in any location or area in contact element 555.

Figure 4:
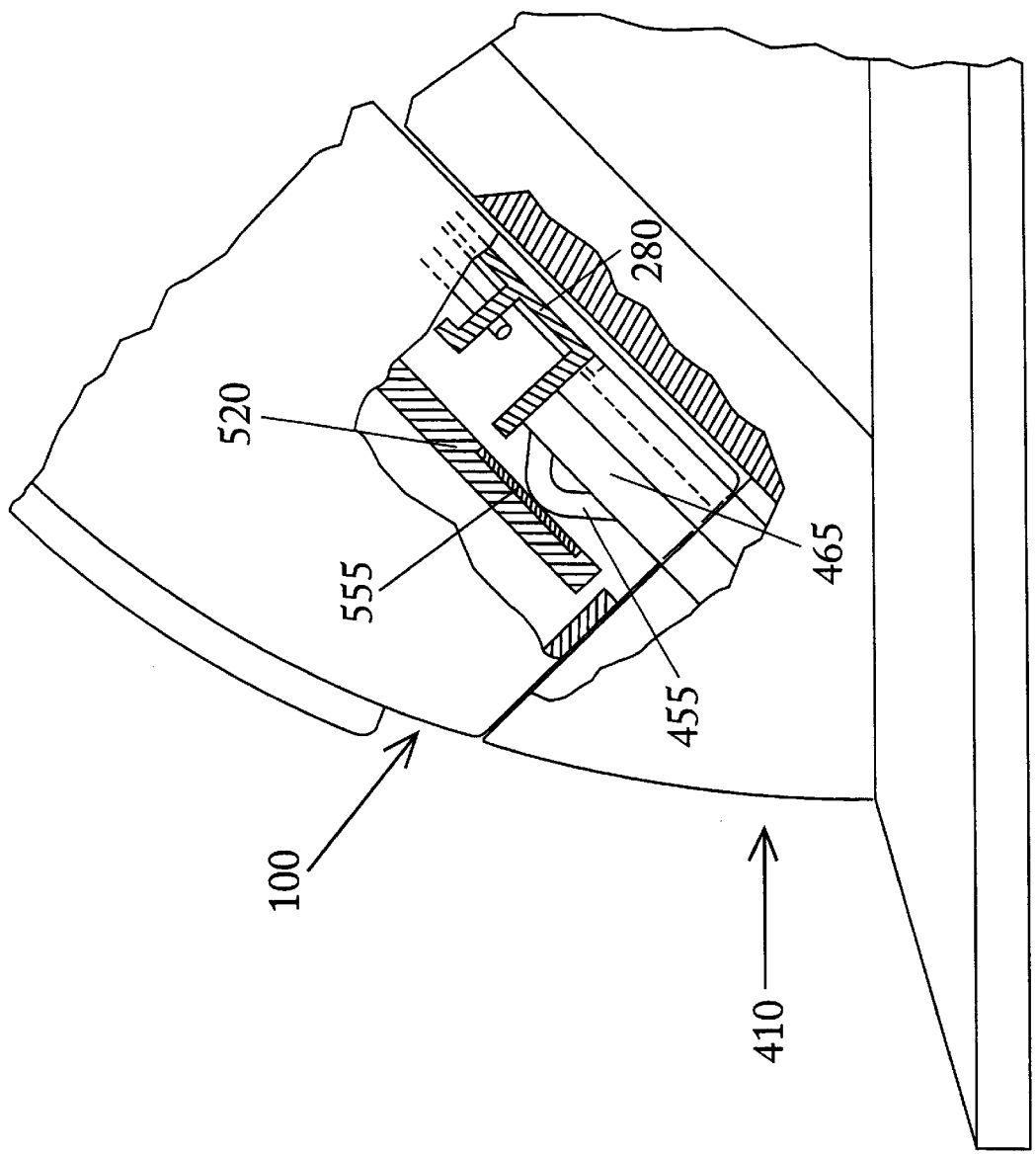
FIG. 4 is a side view illustrating handheld computer mated with a cradle, under an embodiment of the invention.
Figure 5B:
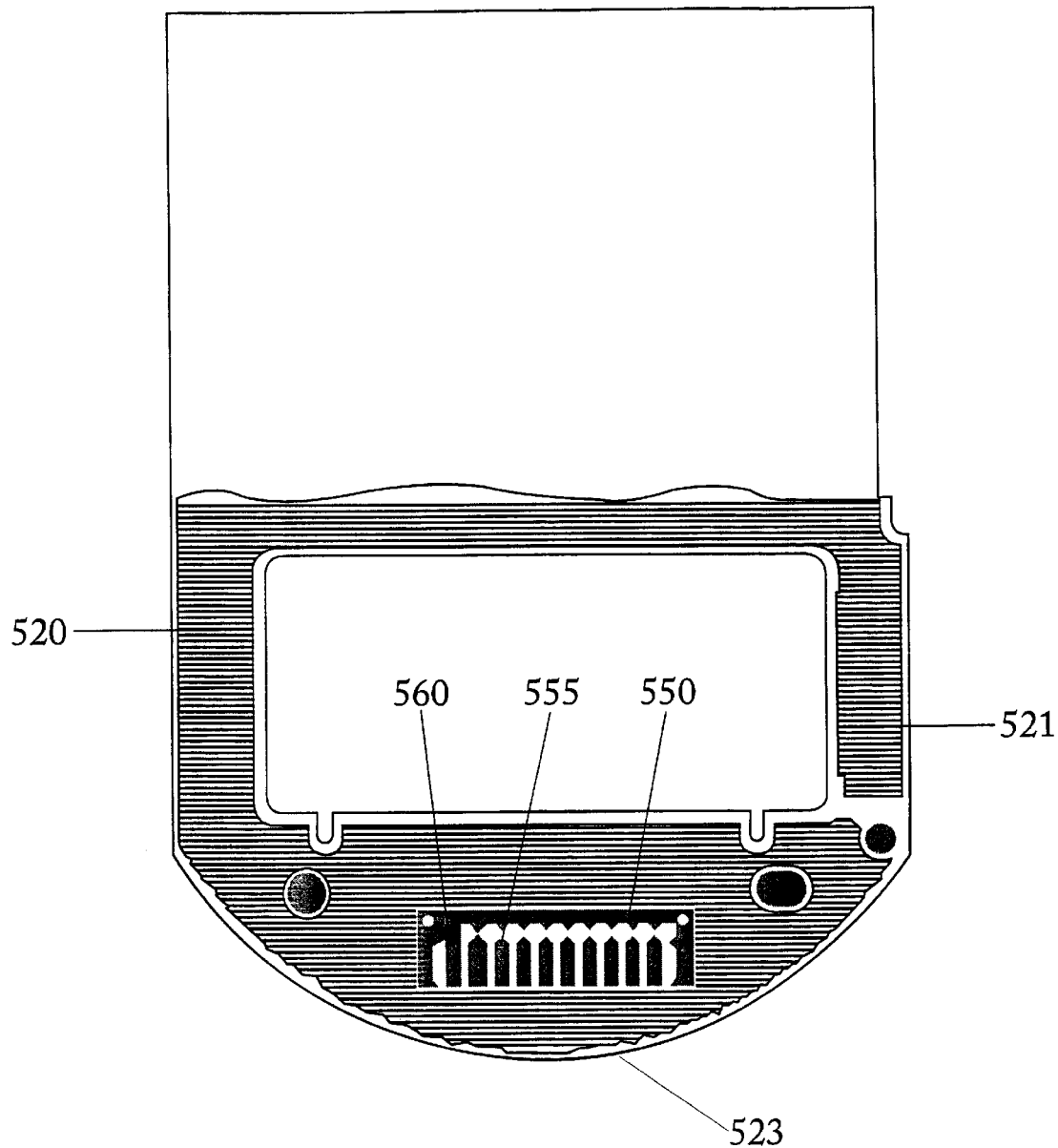
FIG. 5B illustrates the printed circuit board in an embodiment where a ground pad structure partially surrounds conductive elements on the printed circuit board, the conductive elements electrostatic discharge features, under an embodiment of the invention.

FIG. 5B illustrates PCB 520, under another embodiment of the invention. The PCB 520 positions ground pad structure 550 to partially surround the plurality of contact elements 555. The ground pad structure 550 extend between the bottom edge of PCB 520 and the conductive elements 555. This formation allows conductive elements 555 of PCB connector 500 to be positioned closer to bottom edge 523, when compared to embodiments such as described with FIG. 5A. The positioning of PCB connector 500 on PCB 520 allows handheld computer 100 to mate with other devices at different angles or positions, and may also affect the type of connectors that can mate with handheld computer 100. Further, positioning the PCB connector 500 closer to the bottom edge 523 facilitates use of a sliding door structure 280 (FIG. 4) as will be described.

Figure 5C:
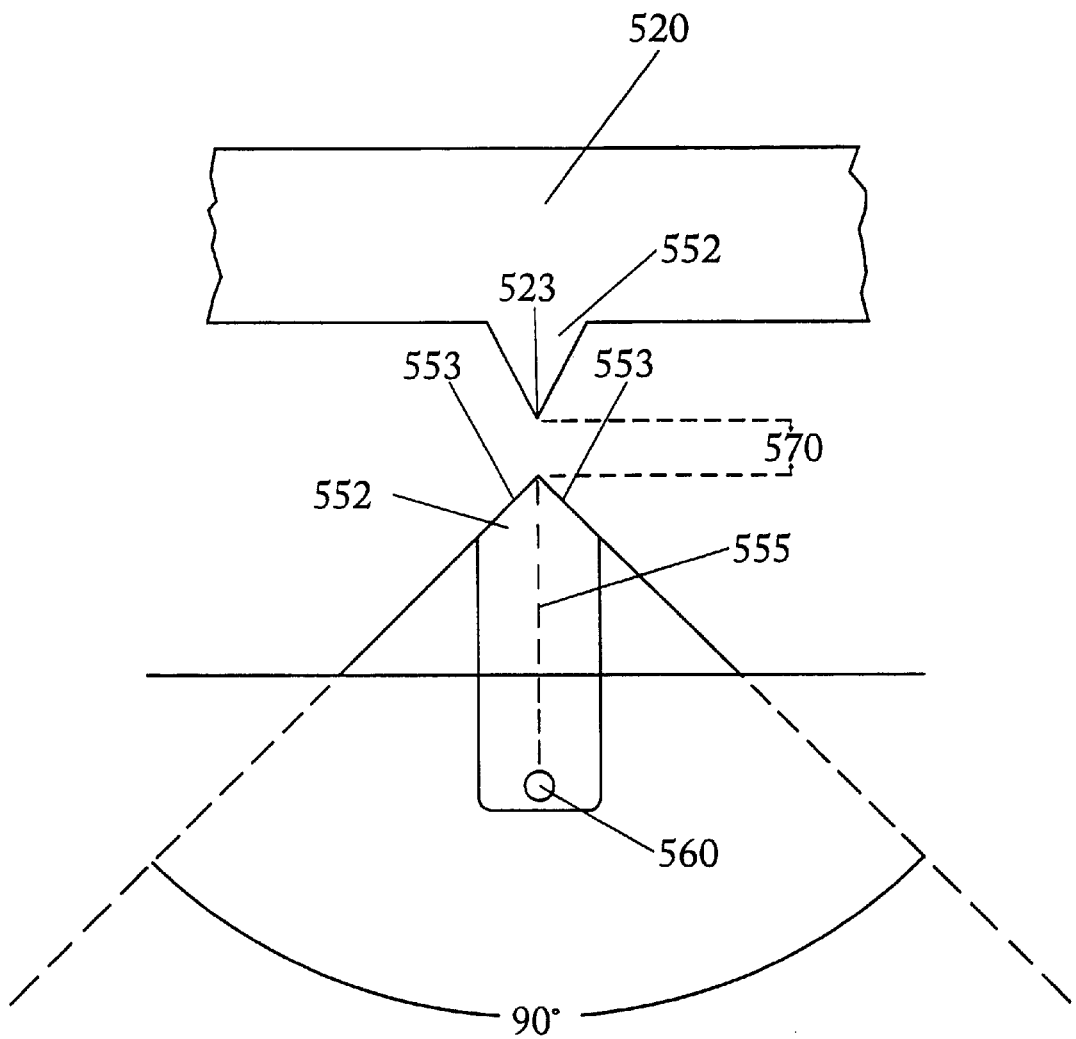
FIG. 5C is a close-up of a conductive element and a ground pad structure forming a spark gap on the printed circuit board, under an embodiment of the invention.

FIG. 5C illustrates conductive element 555 and ground pad structure 550 in greater detail, under an embodiment of the invention. The conductive element 555 is oriented lengthwise within a space surrounded by ground pad structure 550. The contact element 555 includes a pointed portion, shown in FIGS. 5A–5D as pointed end 552. One or more of contact elements 555 includes vias 560 to extend an electrical connection to components on the front side of the PCB 520. With reference to FIG. 5C, vias 560 extends into the paper to electrical components and circuitry on the other side of PCB 520.

The pointed end 552 is a portion of the conductive element 555 that is proximate to ground pad structure 550. The pointed end 552 is formed by a segment that narrows with proximity to ground pad structure 550. In an embodiment, the pointed end 552 forms a distal tip along the lengthwise axis of the contact element.

As shown, the pointed end 552 is formed by two peripheral edges 553 that form an angle. The angle between peripheral edges 553 is preferably ninety degrees. In other embodiments, the pointed end 552 may include a contour to form a rounded tip, rather than a tip formed by two linear edges.

The ground pad structure 550 includes a toothed portion 522 that is proximate to the pointed end 552 of conductive element 555. In an embodiment, toothed portion 522 is also pointed and includes a tip 523 that is proximate to pointed end 552. The pointed end 552 of conductive element 555 is positioned a selectable distance from tip 523 of toothed portion 522. The distance between the pointed end 552 and tip 523 defines spark gap 570. The proximate relationship between pointed end 552 and ground pad structure 550 provides an electrostatic discharge feature for PCB connector 500.

In an embodiment, each conductive element 555 includes a pointed end 552 that is proximate to a corresponding toothed portion 522 of ground pad structure 550. Collectively, the electrostatic discharge features provided by each of the conductive elements 555 enable an electrostatic charge to discharge from one or more conductive elements 555 to ground pad 550. Thus, the electrostatic discharge feature produces point discharge to channel or otherwise bias electrostatic charge from conductive elements 555 across spark gap 570 to ground pad 550. Sufficient static build-up may exceed a breakdown voltage causing static charge to spark across spark gap 570. The break down voltage is significantly less than the voltage required to produce a spark between adjacent conductive conductive elements 555 on PCB connector 500. In this way, spark gap 570 and ground pad structure 550 provide a low impedance discharge path for electrostatic charges to safely discharge to ground rather than to a sensitive components of handheld computer 100.

One factor affecting the threshold level or breakdown voltage is the distance of spark gap 570. In general, a larger spark gap 570 requires a larger break down voltage to cause an electrostatic spark to occur. Preferably, the spark gap 570 is measured so that the breakdown voltage across the spark gap is substantially less than breakdown voltage between adjacent conductive elements 555. Further, spark gap 570 is measured so that the breakdown voltage across the spark gap 570 is less than the breakdown voltage between conductive elements 555 and circuitry, or components near or at connector 550, including conductive traces or circuits.

The spark gap 570 is selected to achieve a desired breakdown voltage resulting from an ESD event. In an embodiment, spark gap 570 is in the range of 0.1 to 0.4 mm, and preferably between 0.2 to 0.3 mm. In one specific embodiment, the dimension of the spark gap 570 are 0.25 mm. In these embodiments, the breakdown voltage ranges from 50 to 500 volts, with a preferred range of 100 to 250 volts. Several design factors and parameters can affect the minimum breakdown voltage across spark gap 570. These include the shape of pointed end 553, the shape of toothed portion 522, and the relative proximity between the pointed end 552 and the toothed end. Other factors include electrical properties of the conductive elements 555 and ground pad structure 550, as well as the number of spark gaps 570 included in PCB connector 500. The exact threshold level may also be affected on factors such as environmental conditions, including temperature and humidity.

Ground pad 550 can be fabricated from electrostatic electrostatic dissipative materials. Examples of such materials include metals such as gold and copper, as well as semi-conductive materials.

Figure 5D:
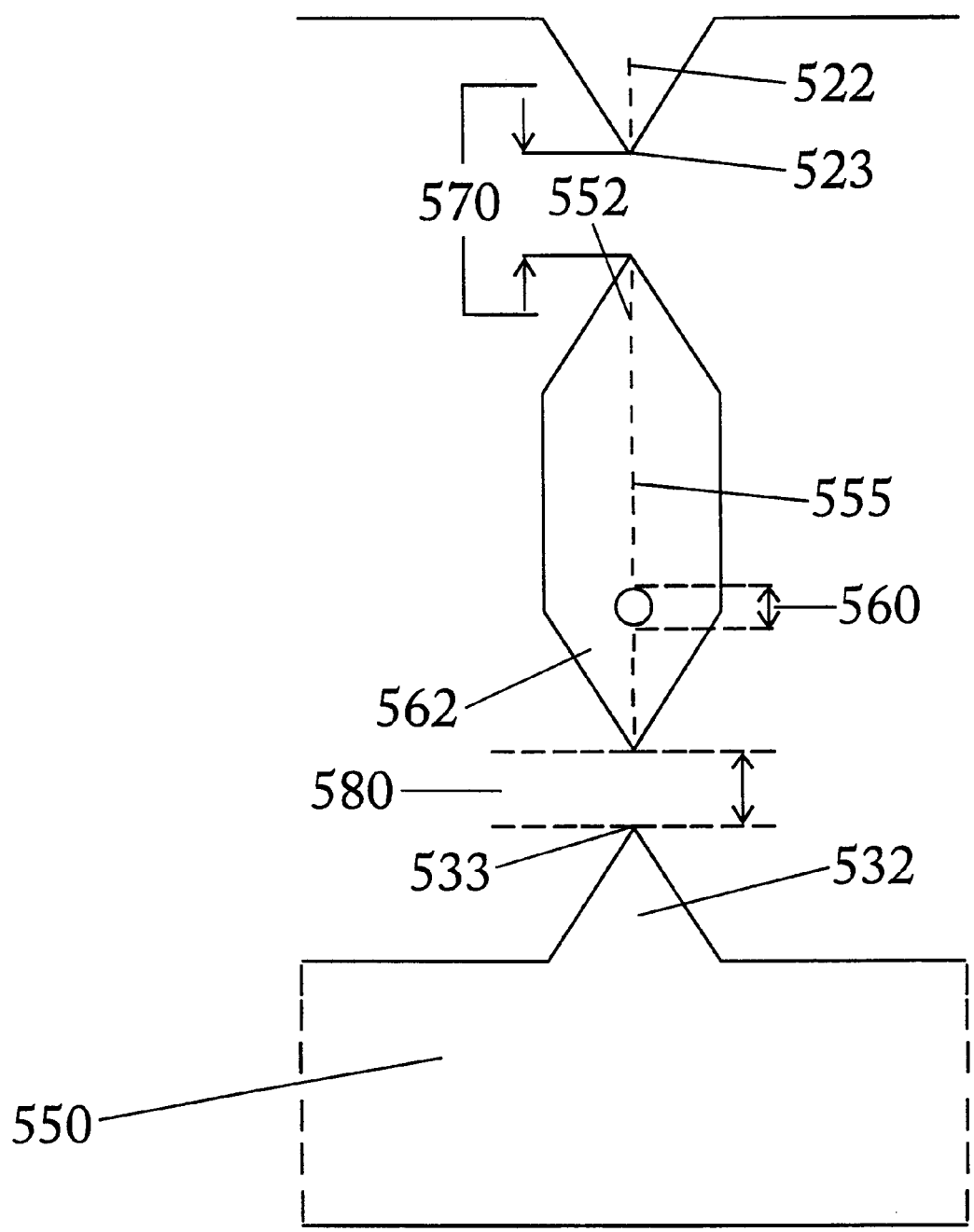
FIG. 5D is a close-up of a conductive element and the ground pad structure forming two spark gaps, under an embodiment of the invention.

FIG. 5D illustrates another embodiment in which conductive element 555 is shaped so as to include a second pointed end 562. The second pointed end 562 is positioned length-wise across from pointed end 552. In this embodiment, ground pad structure 550 is assumed to surround PCB connector 500 on all sides, and separates PCB connector 500 from the bottom edge 523. The ground pad structure 550 includes a plurality of second toothed portion 532. The second toothed portion may also be pointed to include tip 533. Each of the second toothed portions 532 are aligned to form a spark gap 580 with each of the second pointed ends 580, respectively. In this way, each PCB connector 500 includes at least two possible electrostatic dissipitative paths along both directions defined by the length-wise axis.

The use of multiple sparks gaps 570, 580 for each connector elements provides the benefit of a higher degree of reliability of ESD protection by assuring ESD current going in any connector element 555 will have a direct low impedance path to ground pad 520, thereby reducing the risk of arcing to adjacent elements. Further, the use of multiple spark gaps 570, 580 for each conductive element 555 (as shown in FIG. 5A) further improves the reliability of ESD protection by reducing the conductive pathway distance to the ground pad and hence the impedance between each connector element 555 and the ground pad 550.

In an embodiment, the breakdown levels for each spark gap 570, 580 of the conductive elements 555 may be different, or the same. Further, one or more of the conductive elements 555 may be positioned outer contact elements that extend lengthwise next to the ground pad structure 550. In FIG. 5A, the far left and far right conductive elements 555 correspond to outer contact elements. The outer contact elements may be positioned lengthwise to be adjacent the ground pad structure 550 in a lengthwise orientation, so that the distance between the length of that conductive element 555 and ground pad structure 550 also forms a spark gap.

With reference to FIGS. 5C and 5D, one or more of the conductive elements 555 include a vias 560. The vias 560 extend electrical contact from the conductive elements 555 to components on the other side of PCB 520. The electrostatic discharge feature of each conductive element 555 prevents the vias 560 from carrying damaging charges to the components on the front side of PCB 520.

The ground pad 520 can be shaped or positioned as a pad, or as one or more ground traces. In addition, ground pad structure 550 may include one or more vias that extend to additional ground structures on the front side of PCB 520.

In other embodiments, ground pad 550 is conductively coupled to an electrical storage battery, a capacitor, or other energy or charge storage devices so as to better dissipate the ESD charge. Alternatively, the battery itself can comprise the ground pad 550, or the ground pad 550 can be integral to the battery.

Incorporating the spark gap 570 as an electrostatic dissipitative feature of handheld computer 100 provides multiple benefits and improvements over prior connector designs. The benefits include providing protection against ESD damage to all electrical components and circuits on the handheld computer 100. These components include the processor memory, circuitry, and other internal components of the handheld computer 100 from static electric discharges.

In practice, embodiments of the ESD protective PCB connector 500 provide ESD protection to handheld computer 100 in multiple scenarios involving electrostatic discharge. These scenarios include discharges from the accessory device to the handheld computer via the connector of either device or other route, before during or after the connection of the hand-held computer to the accessory device. The ESD protective scenarios also include discharges from the user to the hand-held computer directly or indirectly (e.g. through the accessory device or other electronic device). This is due to the fact that an ESD current from a user will be most likely to enter through the PCB connector 500 (the path of lowest impedance) where it will be channeled/biased to flow across spark gap 570 and into the ground pad 520 where it will be safely dissipated.

FIG. 1 depict a handheld computer 100 that may incorporate an electrostatic discharge feature, as described in embodiments of the invention. The handheld computer 100 has an internal power source (not shown), such as a rechargeable battery. The handheld computer 100 may operate one or more application programs, such as electronic calendar, memos, phone lists, calculators, and emails. The handheld computer 100 may also include an operating system.

Examples of handheld computer 100 include palm style computers such as a PalmPilot™, Palm III™, Palm V™ and Palm VII™ organizers, manufactured by the Palm, Inc. Other examples include Handspring Visor™ and TRG PRO™ devices. Other embodiments of the invention can include handheld computers operating Windows CE™ operating system. Handheld computers may also include wireless enabled devices, such as BlueTooth enabled RF devices, cell phones, and Sprint PCS™ phones.

A housing 110 of handheld computer 100 includes a top and bottom edge 102, 104, and a pair of opposing lateral sides 105. A front face 111 of the handheld computer 100 includes a plurality of input functions keys 115 and a display 114 having graphical user interface features. The input function keys 115 and display 114 may provide data entry. For example, display 114 may be used to enter data into a calendar application operating on handheld computer 100.

In an embodiment, handheld computer 100 communicates with other computer systems through one or more communication ports. Examples of other computer systems include networks such as the Internet, or desktop computers. Examples of communication ports include infra-red (IR) ports (not shown), radio frequency ports, and serial data ports. In an embodiment, connector 150 may be used as a serial data port.

FIG. 2A illustrates a back face 112 of handheld computer 100 that includes a dual style connector 250. In an embodiment, dual connector 250 is an extension of PCB connector 500. The dual connector 250 is used to communicate with other accessory devices that extend functionality of the handheld computer 100. The dual connector 250 may be located at or near bottom edge 104 of housing 110. The position of connector 250 facilitates mating handheld computer 100 with accessory devices.

The dual connector 250 includes a plurality of contact elements 260 contained in an insulative body 255. The combination of contact elements 260 and insulative body 255 may be mounted or otherwise positioned adjacent to the backside 521 of PCB 520 (FIGS. 5A–5D), so that the contact elements 260 are each in electrical contact with a corresponding conductive element 555 on PCB 520 (FIGS. 5A–5D). The insulative body 255 provides insulative material between the individual contact elements 260. In an embodiment, a plurality of extensions 215 are spaced apart to insulate individual contact elements 260 located between adjacent pairs of extensions.

The dual connector 250 is adapted to mate with different types of accessory connectors. In an embodiment, dual connector 250 is matable with either a pogo-style connector or a wiping style connector. Each of the contact elements 260 include a horizontal contact dimension for mating with the wiping style connector and a vertical contact dimension for mating with the pogo-style connector. Dual connector 250 may be mounted with PCB 520 to enable handheld computer 100 to mate with an accessory device having either the wiping style or pogo style connector.

FIG. 2B is an illustrative side view of FIG. 2A. The contact element 260 of dual connector 250 in contact with one of the leads 555 of PCB connector 500. As shown, a vertical dimension 262 of contact element 260 receives pogo-style connector 410. A horizontal dimension 264, shown in FIG. 3A as being relatively planar with PCB 520, receives wiping style connector 420. FIG. 3A illustrates only one contact element 260 of dual connector 250, in contact with one lead 555 of PCB connector 500. Other elements of dual connector 250 may individually contact leads 555 of PCB connector 500 in the same manner.

The contact element 260 is a portion of a structure that includes other contact elements 260 and insulative body 255. The structure may be mounted so that the vertical dimension 262 of the contact element 260 is in contact with conductive element 555 of PCB connector 500. For example, the structure may be integrated as part of the housing, and dimensioned so that the vertical dimension 262 (or other components) is in contact with the conductive element 555.

In other embodiments, PCB connector 500 may mate directly with connectors of other accessory devices. In particular, PCB connector 500 may mate with wiping style connectors. For example, PCB connector 500 may mate with communication cradle 400.

FIG. 2C illustrates a back face 275 of handheld computer 100, that includes a sliding door structure 280, under an embodiment of the invention The sliding door structure 280 houses PCB connector 500 (FIGS. 5A–5B). The sliding door structure 280 is moveable between an open and closed position. In the open position, the sliding door structure 280 is biased to move into the closed position by a spring (not shown). PCB connector 500 is positioned on PCB 520 so as to mate with a wiping style connector of an accessory device.

FIG. 3A illustrates a pogo style connector 300 of an accessory device that is matable with handheld computer 100. The pogo connector 300 includes a plurality of connector elements 310, each of which may be shaped as circular shaped extensions. Each connector element 310 of the pogo style connector 300 is spring-biased when moved inwards. The pogo style connector may be used to make accessory devices such as battery charges to the handheld computer.

Figure 3B:
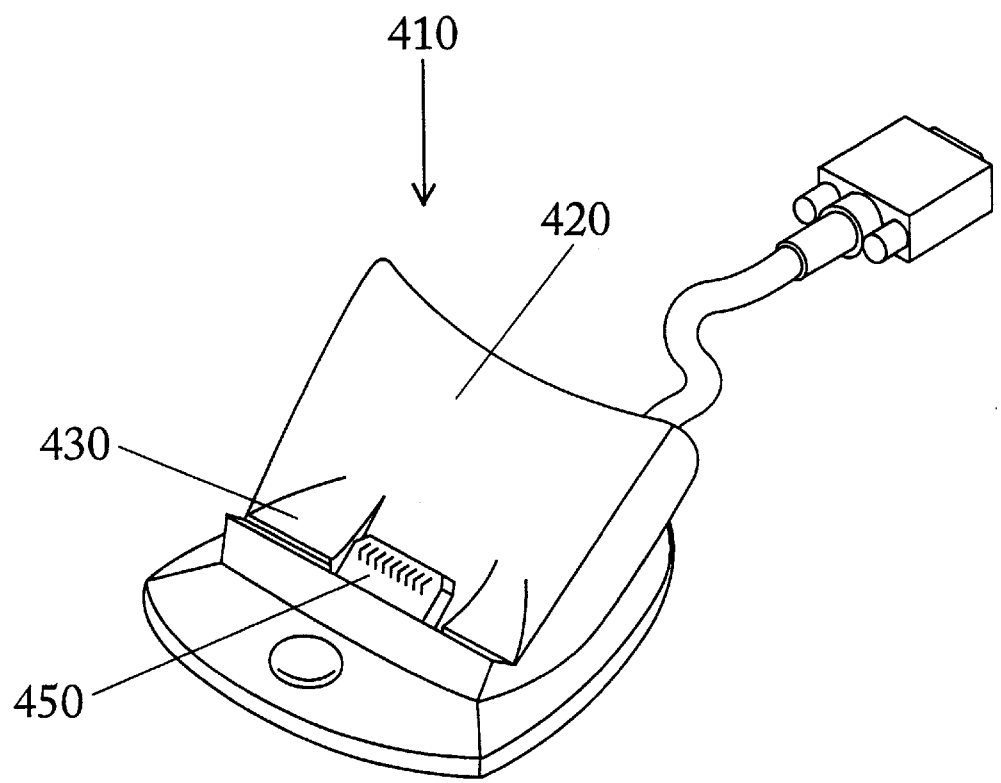
FIG. 3B illustrates a handheld computer mated with a communication cradle, under an embodiment of the invention.

FIG. 3B illustrates a cradle 410 including a base 415 that rests on a platform or floor. The communication cradle 410 includes a mating connector 450 to connect with PCB connector 500. The cradle 410 includes a tilted front face 420 that merges into a ledge 430. The ledge 430 supports handheld computer 100. In this way, handheld computer 100 is rested on the ledge 430 to cause PCB connector 500 to mate with connector 450. The tilt of the front face 420 combined with the support of the ledge 430 serves to retain the handheld computer 100 on the cradle 400.

The mating connector 450 includes a plurality of connector elements 455. In another embodiment, one or more of the plurality of connector elements 455 may include an electrostatic discharge feature, such as described with embodiments of handheld computer 100.

FIG. 4 illustrates handheld computer 100 mated with communication cradle 410, under an embodiment where handheld computer 100 includes sliding door structure 280. When handheld computer 100 is mated with communication cradle 410, sliding door 280 is moved into the open position. In an embodiment, sliding door 280 is positioned to be pushed into the open position by structure 465 of connector 450 on communication cradle 410. In the open position, PCB 520 and PCB connector 500 are exposed to mating connector 450. In the embodiment shown, contact element 455 of connector 450 is a wiping style element. The sliding door structure 280 may be moved into the open position by resting handheld computer 100 on communication cradle 410. The position of PCB connector 500 and sliding door structure 280 relative to a connector structure 415 (FIG. 4A) on the communication cradle 410 enables handheld computer 100 to mate with communication cradle 420.

The foregoing description of various embodiments of the invention has been presented for purposes of illustration and description. It is not intended to limit the invention to the precise forms disclosed. Obviously, many modifications, variations and different combinations of embodiments will be apparent to practitioners skilled in the art. Also, it will be apparent to the skilled practitioner that elements from one embodiment can be readily recombined with one or more other embodiments.

In an alternative embodiment, an accessory device for handheld computer 100 includes the electrostatic discharge feature. For example, one or more connector elements on communication cradle 410 include a pointed end spaced from a ground, thereby forming a spark gap.

What is claimed is:

1. A connector assembly for a handheld computer, the connector assembly comprising:
    a plurality of conductive elements disposed on a first side of a printed circuit board housed with the handheld computer, a first conductive element in the plurality of conductive elements having a pointed end;
    a plurality of contacts, each of the contacts contacting one of the plurality of conductive elements, each contact including a first surface to mate with a connector element of a first type of accessory connector, and a second surface to mate with a connector element of a second type of accessory connector; and
    a ground pad disposed on the printed circuit board, the ground pad including a contour positioned sufficiently proximate to the pointed end of the first conductive element to form a spark gap, the spark gap transferring an electrostatic discharge formed on one or more of the plurality of conductive elements to the ground pad when the electrostatic discharge exceeds a sufficient level.

2. The connector assembly of claim 1, where the first surface of each contact mates with the connector element of a wiping style connector on an accessory device.

3. The connector assembly of claim 2, wherein the second surface of each contact mates with the connector element of a pogo style connector on the accessory device.

4. The connector element of claim 1, wherein the first surface of the contact is aligned to be acute or perpendicular to the second surface of the contact.

5. The connector assembly of claim 1, further comprising at least one vias associated with the first conductive element to transfer electrostatic discharge from the pointed end of the first conductive element to the ground pad.

6. The connector assembly of claim 1, wherein the grand pad includes a plurality of interior sides that define an interior space that at least partially surrounds the plurality of conductive elements on three or more interior sides, at least one of the interior sides having a saw tooth contour wherein at least a portion of the saw tooth contour is positioned relative to the pointed end of the first conductive element to define the spark gap.

7. The connector assembly of claim 1, wherein the spark gap has a length of about 0.20 mm to about 0.30 mm.

8. The connector assembly of claim 1, wherein the spark gap has a gap distance of about 0.25 mm.

9. The connector assembly of claim 1, wherein the contour is positioned sufficiently proximate to the pointed end to transfer the electrostatic discharge exceeding 100 volts.

10. The connector assembly of claim 1, wherein the contour is positioned sufficiently proximate to the pointed end to transfer the electrostatic discharge exceeding t 100 volts but less than 250 volts.

11. The connector assembly of claim 1, wherein the point end of the first conductive element is formed by at least two linear sides.

12. The connector assembly of claim 11, wherein the pointed end of the first conductive element has a triangular shape.

13. The connector assembly of claim 1, wherein each of the plurality of conductive elements are equidistantly spaced from one another.

14. The connector assembly of claim 1, wherein the ground pad is adapted to be coupled to a charge storage device.

15. The connector assembly of claim 14, wherein the charge storage device includes one of a electric battery or a capacitor.

* * * * *